United States Patent [19]

Ehman et al.

[11] Patent Number: 4,968,935
[45] Date of Patent: Nov. 6, 1990

[54] SELECTIVE REPHASING OF NMR SIGNALS TO SUPPRESS MOTION ARTIFACTS

[75] Inventors: Richard L. Ehman; Joel P. Felmlee, both of Rochester, Minn.

[73] Assignee: Mayo Foundation for Medical Education and Research, Rochester, Minn.

[21] Appl. No.: 405,892

[22] Filed: Sep. 11, 1989

[51] Int. Cl.⁵ .......................................... G01R 33/20
[52] U.S. Cl. ..................................... 324/309; 324/306
[58] Field of Search ............... 324/300, 306, 307, 309, 324/310, 311, 312, 313, 314, 318, 322

[56] References Cited

U.S. PATENT DOCUMENTS

| | | | |
|---|---|---|---|
| 4,654,591 | 3/1987 | Moran | 324/306 |
| 4,720,678 | 1/1988 | Glover | 324/309 |
| 4,812,760 | 3/1989 | Bottomley | 324/309 |
| 4,857,846 | 8/1989 | Carlson | 324/309 |

Primary Examiner—Michael J. Tokar
Attorney, Agent, or Firm—Quarles & Brady

[57] ABSTRACT

Motion artifacts are selectively suppressed in an image by correcting only the NMR data in the central views. The peripheral views are not corrected with the result that motion artifacts produced by large objects in the image are suppressed while motion artifacts produced by small objects are not. Consequently, the interior of small blood vessels remain darker in the reconstructed image.

4 Claims, 5 Drawing Sheets

SELECTIVE REPHASING OF NMR SIGNALS TO SUPPRESS MOTION ARTIFACTS

BACKGROUND OF THE INVENTION

The field of the invention is nuclear magnetic resonance imaging methods and systems. More particularly, the invention relates to a method for reducing image artifacts caused by flow and motion.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_z$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the z-y plane to produce a net transverse magnetic moment $M_1$, which is rotating, or spinning, in the x-y plane at the Larmor frequency. The degree to which the net magnetic moment $M_z$ is tipped, and hence the magnitude of the net transverse magnetic moment $M_1$ depends primarily on the length of time and the magnitude of the applied excitation field $B_1$.

The practical value of this phenomenon resides in the signal which is emitted by the excited spins after the excitation signal $B_1$ is terminated. In simple systems the excited spin induce an oscillating sine wave signal in a receiving coil. The frequency of this signal is the Larmor frequency, and its initial amplitude, $A_0$, is determined by the magnitude of the transverse magnetic moment $M_1$. The amplitude, A, of the emission signal decays in an exponential fashion with time, t:

$$A = A_0 e^{-t/T^*2}$$

The NMR measurements of particular relevance to the present invention are called "pulsed NMR measurements". Such NMR measurements are divided into a period of excitation and a period of signal emission. Such measurements are performed in a cyclic manner in which the NMR measurement is repeated many times to accumulate different data during each cycle or to make the same measurement at different locations in the subject. A wide variety of preparative excitation techniques are known which involve the application of one or more excitation pulses ($B_1$) of varying magnitude and duration. Such excitation pulses may have a narrow frequency spectrum (selective excitation pulse), or they may have a broad frequency spectrum (nonselective excitation pulse) which produces transverse magnetization $M_1$ over a range of resonant frequencies. The prior art is replete with excitation techniques that are designed to take advantage of particular NMR phenomena and which overcome particular problems in the NMR measurement process.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

NMR data for constructing images can be collected using one of many available techniques, such as multiple angle projection reconstruction and Fourier transform (FT). Typically, such techniques comprise a scan made up of a plurality of sequentially implemented views. Each view may include one or more NMR experiments, each of which comprises at least an RF excitation pulse and a magnetic field gradient pulse to encode spatial information into the resulting NMR signal. As is well known, the NMR signal may be a free indication decay (FID) or, preferably, a spin-echo signal.

The preferred embodiments of the invention will be described in detail with reference to a variant of the well known FT technique, which is frequently referred to as "spinwarp". The spin-warp technique is discussed in an article entitled "Spin Warp NMR Imaging and Applications to Human Whole-Body Imaging" by W.A. Edelstein et al., *Physics in Medicine and Biology*, Vol. 25, pp. 751-756 (1980).

Briefly, the spin-warp technique employs a variable amplitude phase encoding magnetic field gradient pulse prior to the acquisition of NMR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a read-out magnetic field gradient ($G_x$) in a direction orthogonal to the phase encoding direction. The read-out gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of views that are acquired during the scan to produce a set of NMR data from which an entire image can be reconstructed.

Object motion during the acquisition of NMR image data produces both blurring and "ghosts" in the reconstructed image. Ghosts are particularly apparent when the motion is periodic, or nearly so. For most physiological motion each view of the NMR signal is acquired in a period short enough that the object may be considered stationary during the acquisition window. In such case the blurring and ghosting is due to the inconsistent appearance of the object from view to view. Motion that changes the appearance between views such as that produced by a patient moving, by the respiration or the cardiac cycle, or by peristalsis, is referred to hereinafter as "view-to-view motion". Motion may also change the amplitude and phase of the NMR signal as it evolves during the pulse sequence and such motion is referred to hereinafter as "in-view motion".

Both blurring and ghosting can be reduced if the data acquisition is synchronized with the functional cycle of the object to reduce view-to-view motion. This method is known as gated NMR scanning, and its objective is to acquire NMR data at the same point during successive functional cycles so that the object "looks" the same in each view. The drawback of gating is that NMR data may be acquired only during a small fraction of the object's functional cycle, and even when the shortest acceptable pulse sequence is employed, the gating technique can significantly lengthen the data acquisition time. In addition, the physiology governing these motions is not truly periodic and the gating can become unsynchronized and, hence, ineffective. Some of these methods are disclosed in U.S. Pat. Nos. 4,751,462; 4,567,893 and 4,663,591.

Several NMR pulse sequences have been proposed to either desensitize the NMR measurement to the phase perturbations caused by flowing spins as described in U.S. Pat. Nos. 4,731,583 and 4,728,890, or to sensitize it to flow in such a manner that the effects of flow can properly be separated from the reconstructed images as described in U.S. Patent No. RE 32,701. While these "gradient moment nulling" methods do effectively correct for the dephasing effects caused by the application of magnetic field gradients to moving spins, the resulting images are not entirely satisfactory from a medical diagnostic standpoint. More specifically, the rephasing of the NMR signals produced by moving blood causes the interior of blood vessels to appear brighter in the image. Since the surrounding tissues may also be bright, such corrected images make it difficult for the radiologist to precisely locate important vascular structures in the image.

A more recent method for suppressing motion artifacts in NMR images focuses on correction of the acquired NMR data set after the scan is completed. This "retrospective" method involves the manipulation of the entire acquired NMR data set to correct for view-to-view motion artifacts and in-view motion artifacts as described in co-pending U.S. patent application serial no. 276,168, filed on Nov. 23, 1988 and entitled "Adaptive Method For Reducing Motion and Flow Artifacts In NMR Images".As with the gradient moment nulling techniques, these retrospective correction techniques may cause secondary problems in the reconstructed images from a medical diagnostic standpoint, since they accurately place the signals produced by moving blood back into the blood vessels and make it more difficult to observe blood vessel pathologies.

SUMMARY OF THE INVENTION

The present invention relates to the improvement of medical images produced by an NMR system by selectively correcting the NMR data for motion artifacts. By selectively correcting the NMR data, motion artifacts of large scale structures are suppressed without detrimentally affecting the appearance of small blood vessels.

It is a discovery of the present invention that if selected, central, or low order, phase encoding views of the acquired NMR data are corrected for motion artifacts, that the benefits of the motion artifact suppression method can be achieved without unduly brightening the interior of blood vessels. This is believed to result from the fact that the image is reconstructed using a Fourier transformation and that the central views of the NMR data set contribute to the definition of the large scale objects in the image, while the peripheral, or high order, phase encoding views in the NMR data set contribute primarily to the definition of the small objects. As a consequence, if the peripheral views in the NMR data set are not corrected for motion artifacts, only the small objects in the reconstructed image are not corrected.

A general object of the invention is to employ motion artifact suppression techniques to an NMR image without reducing the medical diagnostic value of the image. By applying the motion artifact suppression technique only to a selected few of the central views of the acquired NMR data set, small objects in the reconstructed image are substantially unaffected. As a result, the signals produced by blood flowing in small vessels are not corrected and the interior of small blood vessels remain dark in the image.

A more specific object of the invention is to improve the diagnostic value of NMR medical images produced using a gradient moment nulling technique. The additional gradient pulses needed to rephase spin according to this technique are employed only in the pulse sequences used to acquire the selected central views of the NMR data set. The remaining views of the data set are acquired without these motion artifact suppressing gradient pulses. In an NMR data set with 256 views, best results are obtained when only the central four to eight views are acquired with a gradient moment nulling pulse sequence.

Another object of the invention is to reduce gradient coil heating. Since only a selected few of the total number of acquired views requires the application of gradient moment nulling pulses, the amount of electrical energy applied to the gradient coils and the consequent production of heat is substantially reduced.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
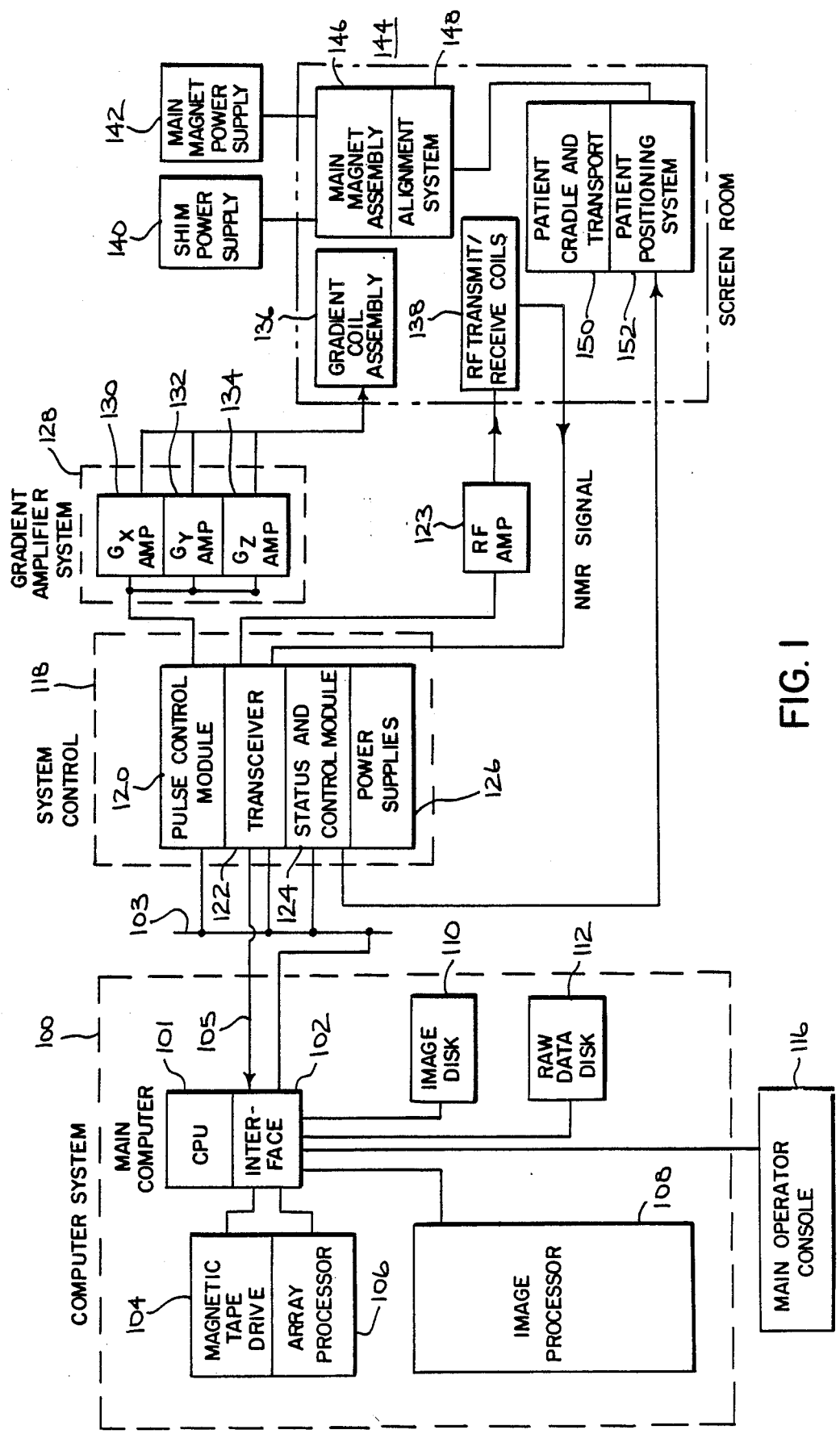
FIG. 1 is a block diagram of an NMR system which employs the present invention.

Referring to FIG. 1, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (a Data General MV4000). The computer 100 includes an interface 102 through which a plurality of computer peripheral devices and other NMR system components are coupled to the main computer 101. Among the computer peripheral devices is a magnetic tape drive 104 which may be utilized under the direction of the main computer 101 for archiving patient data and image data to tape. Processed patient data may also be stored in an image disc storage device designated 110. An array processor 106 is utilized for preprocessing acquired NMR data and for image reconstruction. The function of image processor 108 is to provide interactive image display manipulation such as magnification, image comparison, gray-scale adjustment and real time data display. The computer system 100 also includes a means to store raw NMR data (i.e. before image construction) which employs a disc data storage system designated 112. An operator console 116 is also coupled to the main computer 101 by means of interface 102, and it provides the operator with the means to input data pertinent to a patient study as well as additional data necessary for proper NMR system operation, such as calibrating, initiating and terminating scans. The operator console is also used to display images stored on disc or magnetic tape.

The computer system 100 exercises control over the NMR system by means of a system control 118 and a gradient amplifier system 128. Under the direction of a stored program, the computer 100 communicates with system control 118 by means of a serial communication network 103 (such as the Ethernet network) in a manner well known to those skilled in the art. The system control 118 includes several subsystems such as a pulse control module (PCM) 120, a radio frequency transceiver 122, a status control module (SCM) 124, and power supplies generally designated 126. The PCM 120 utilizes control signals generated under program control by main computer 101 to generate digital waveforms which control gradient coil excitation, as well as RF envelope waveforms utilized in the transceiver 122 for modulating the RF excitation pulses. The gradient waveforms are applied to the gradient amplifier system 128 which is comprised of $G_x$, $G_y$ and $G_z$ amplifiers 130, 132 and 134, respectively. Each amplifier 130, 132 and 134 is utilized to excite a corresponding gradient coil in an assembly designated 136 which is part of a magnet assembly 146. When energized, the gradient coils generate magnetic field gradients $G_x$, $G_y$ and $G_z$.

The gradient magnetic fields are utilized in combination with radio frequency pulses generated by transceiver 122, RF amp 123 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency signal to an RF power amplifier 123 which then energizes RF coils 138 which are situated within main magnet assembly 146. The NMR signals radiated by the excited spin in the patient are sensed by the same or a different RF coil than is used for transmitting. The signals are detected, amplified, demodulated, filtered, and digitized in the receiver section of the transceiver 122. The processed signals are transmitted to the main computer 101 by means of a dedicated, unidirectional, high-speed digital link 105 which links interface 102 and transceiver 122.

The PCM 120 and SCM 124 are independent subsystems both of which communicate with main computer 101, peripheral systems, such as patient positioning system 152, as well as to one another by means of serial communications link 103. The PCM 120 and SCM 124 are each comprised of a 16-bit microprocessor (such as Intel 8086) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148, a shim coil power supply 140, and a main magnet power supply 142. The main power supply 412 is utilized to bring the polarizing field produced by the magnet to the proper operating strength of 1.5 Tesla and is then disconnected.

To minimize interference from external sources, the NMR system components comprised of the main magnet assembly, the gradient coil assembly, and the RF transmit and receiver coils, as well as the patient-handling devices, are enclosed in an RF shielded room generally designated 144. The shielding is generally provided by a copper or aluminum screen network which encloses the entire room. The screen network serves to contain the RF signals generated by the system, while shielding the system from RF signals generated outside the room.

Figure 2:
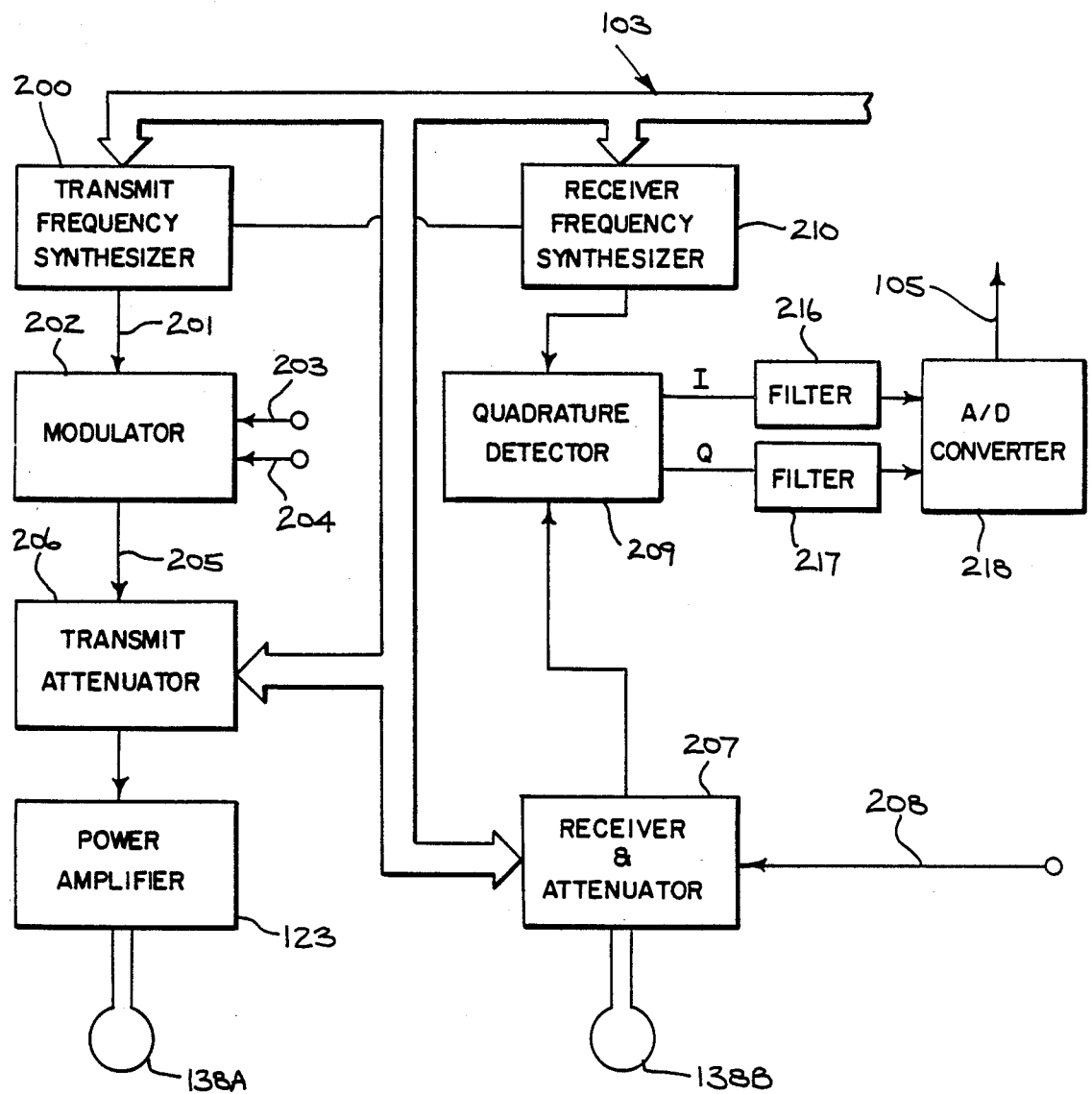
FIG. 2 is an electrical block diagram of the transceiver which forms part of the NMR system of FIG. 1.

Referring particularly to FIGS. 1 and 2, the transceiver 122 includes components which produce the RF excitation field $B_1$ through power amplifier 123 at a coil 138A and components which receive the resulting NMR signal induced in a coil 138B. The base, or carrier, frequency of the RF excitation field is produced by a frequency synthesizer 200 which receives a set of digital signals through the communications link 103 from the main computer 101. These digital signals indicate the frequency which is to be produced at an output 201 at a resolution of one Hertz. This commanded RF carrier is applied to a modulator 202 where it is frequency and amplitude modulated in response to signals received through line 203, and the resulting RF excitation signal is turned on and off in response to a control signal which is received from the PCM 120 through line 204. The magnitude of the RF excitation pulse output through line 205 is attenuated by a transmit attenuator circuit 206 which receives a digital signal from the main computer 101 through communications link 103. The attenuated RF excitation pulses are applied to the power amplifier 123 that drives the RF transmitter coil 138A.

Referring still to FIGS. 1 and 2, the NMR signal produced by the excited spin in the subject is picked up by the receiver coil 138B and applied to the input of a receiver 207. The receiver 207 amplifies the NMR signal and this is attenuated by an amount determined by a digital attenuation signal received from the main computer 101 through link 103. The receiver 207 is also turned on and off by a signal through line 208 from the PCM 120 such that the NMR signal is acquired only over the time intervals required by the particular acquisition being performed.

The received NMR signal is demodulated by a quadrature detector 209 to produce two signals I and Q that are coupled through anti-aliasing filters 216 and 217 to a pair of analog to digital converters indicated collectively at 218. The quadrature detector 209 also receives an RF reference signal from a second frequency synthesizer 210 and this is employed by the quadrature detector 209 to sense the amplitude of that component of the NMR signal which is in phase with the transmitter RF carrier (I signal) and the amplitude of that component of the NMR signal which is in quadrature therewith (Q signal).

The I and Q components of the received NMR signal are continuously sampled and digitized by the A/D converter 218 at a sample rate of 32 or 64 kHz throughout the acquisition period. A set of 256 digital numbers are acquired for each I and Q component of the NMR signal, and these digital numbers are conveyed to the main computer 101 through the serial link 105.

Figure 3:
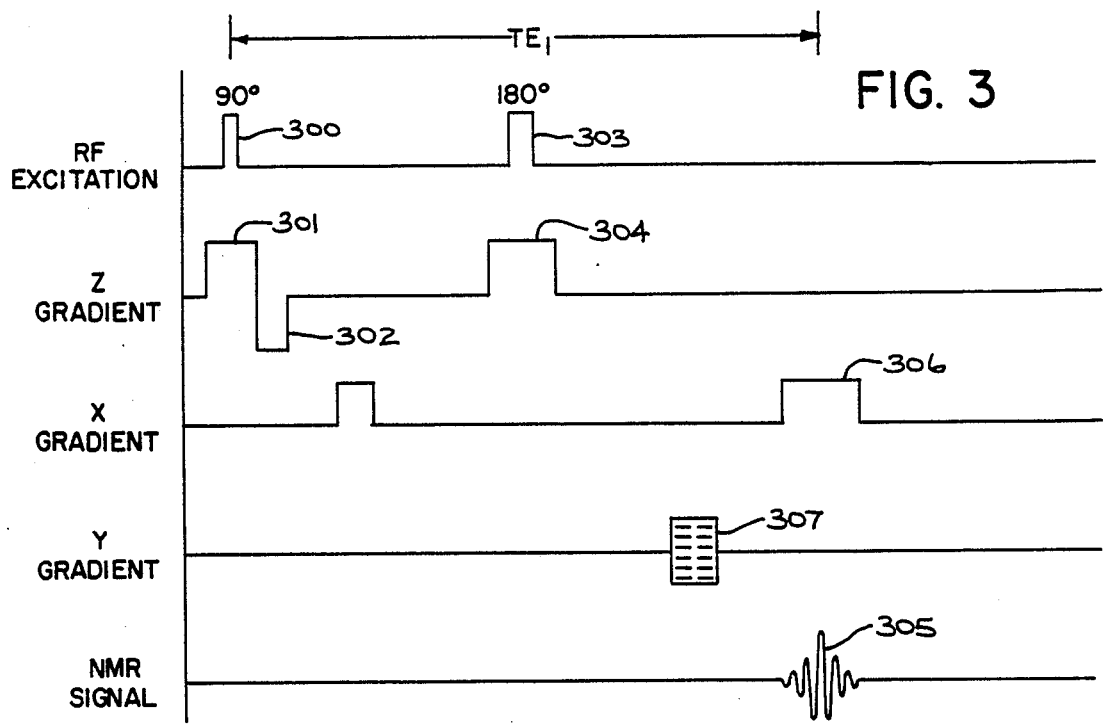
FIG. 3 is a graphic representation of a conventional NMR pulse sequence used to acquire data to produce an image.

The NMR system of FIG. 1 performs a series of pulse sequences to collect sufficient NMR data to reconstruct an image. One such pulse sequence is shown in FIG. 3. This sequence performs a slice selection by applying a 90° selective RF excitation pulse 300 in the presence of a z axis gradient pulse 301 and its associated rephasing pulse 302. After an interval $TE_1/2$, a 180° selective RF excitation pulse 303 is applied in the presence of another z axis gradient pulse 304 to refocus the transverse magnetization at the time $TE_1$ and produce an echo NMR signal 305.

To position encode the echo NMR signal 305, an x axis read-out gradient pulse 306 is applied during the acquisition of the NMR signal 305. The read-out gradient frequency encodes the NMR signal 305 in the well known manner. In addition, the echo NMR signal 305 is position encoded along the y axis by a phase encoding gradient pulse 307. The phase encoding gradient pulse 307 has one strength during each echo pulse sequence and associated NMR echo signal 305, and it is typically incremented in steps through 256 discrete strengths ($-128$ to $+128$) during the entire scan. As a result, each of the 256 NMR echo signals 305 acquired during the scan is uniquely phase encoded.

It is, of course, usual practice to repeat the pulse sequence for each phase encoding gradient value one or more times and to combine the acquired NMR signals in some manner to improve signal-to-noise and to offset irregularities in the magnetic fields. In the following discussion, it is assumed that such techniques may be used.

Figure 4:
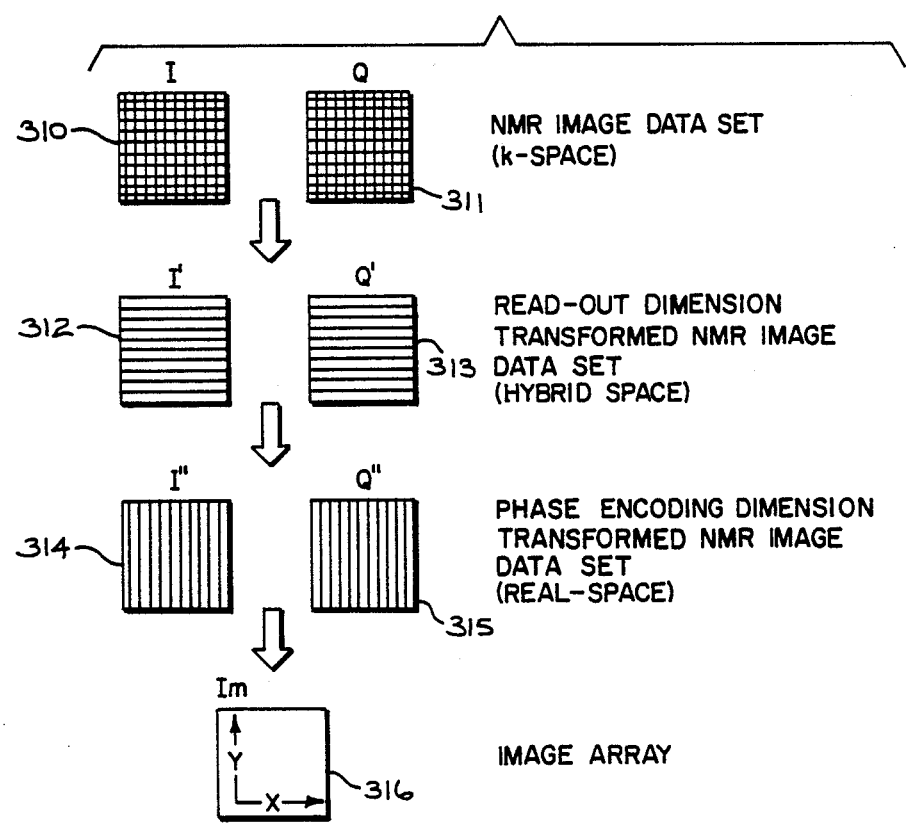
FIG. 4 is a pictorial representation of how an image is reconstructed from the NMR data acquired using the pulse sequence of FIG. 3.

Referring particularly to FIG. 4, the acquired NMR data is stored in the data disk 112 (FIG. 1) in the form of two 256 X 256 element arrays 310 and 311. The array 310 contains the in-phase magnitude values I and the array 311 contains the quadrature values Q. Together these arrays 310 and 311 form an NMR image data set which defines the acquired image in what is referred to in the art as "k-space".

To convert this k-space NMR data set into data which defines the image in real space (i.e. Cartesian coordinates), a two step Fourier transformation is performed on the I and Q arrays 310 and 311. The transformation is performed first in the read-out direction which is the horizontal rows of the arrays 310 and 311 to produce two 256 X 256 element arrays 312 and 313. The array 312 contains the in-phase data and is labeled I', while the array 313 contains the quadrature data and is labeled Q'. The I' and Q' arrays 312 and 313 define the acquired image in what is referred to in the art as "hybrid-space". This first transformation of the acquired NMR data set is expressed mathematically as follows:

$$S_{xy}(k\text{-space}) \rightarrow S_{x'y} \text{ (hybrid-space)} \qquad (1)$$

$$S_{x'y} = \frac{1}{256} \sum_{x=0}^{255} S_{xy} e^{-i2\pi xx'/256}$$

The second transformation is performed in the phase encoding direction which is the vertical columns of the arrays 312 and 313 to produce two 256 X 256 element arrays 314 and 315. The array 314 contains the transformed in-phase values and is labeled I'', while the array 315 contains the quadrature values and is labeled Q''. This second transformation may be expressed mathematically as follows:

$$S_{x'y}(\text{hybrid-space}) \rightarrow S_{x'y'} \text{ (real space)} \qquad (2)$$

$$S_{x'y'} = \frac{1}{256} \sum_{y=0}^{255} S_{x'y} e^{-i2\pi yy'/256}$$

The arrays 314 and 315 are a data set which defines the acquired image in real space and the elements thereof are used to calculate the intensity values in a 256 X 256 element image array 316 in accordance with the following expression:

$$Im_{xy} = \sqrt{(I'_{xy})^2 + (Q'_{xy})^2} \qquad (3)$$

The 256 X 256 elements of the image array 316 are mapped to the main operator console 116 (FIG. 1) for display on a CRT screen.

The above described NMR system and pulse sequence produces good images when the subject being imaged is stationary. When the spins are moving, however a variety of motion artifacts can be produced in the reconstructed image. The present invention pertains to the suppression of such motion artifacts and, particularly, to the suppression of artifacts caused by "in-view" motion. The most common causes of such artifacts is the flow of fluids in the subject, respiratory and cardiac movement, involuntary movements, and peristaltic motion in the esophagus and abdominal region.

One well known artifact suppression technique, which is referred to in the art as gradient moment nulling, reduces motion artifacts by eliminating the spin dephasing which occurs when motion is present during the application of one of the gradient pulses $G_x$, $G_y$ or $G_z$. This technique involves the addition of one or more gradient pulses to the sequence which offsets the dephasing effects caused by the gradient pulses in the standard pulse sequence such as that of FIG. 3. As a result, the spins are rephased when the NMR echo signal 305 is acquired and an accurate image can be reconstructed. For a more detailed description of the gradient moment nulling technique, reference is made to U.S. Pat. No. 4,728,890 which issued to Pattany et al. on Mar. 1, 1988 and is entitled "Motion Artifact Suppression Technique of Magnetic Resonance Imaging", and U.S. Pat. No. 4,731,583 which issued to Glover et al. on Mar. 15, 1988 and is entitled "Method For Reduction of MR Image Artifacts Due To Flowing Nuclei By Gradient Moment Nulling", both of which are incorporated herein by reference.

Figure 5A:
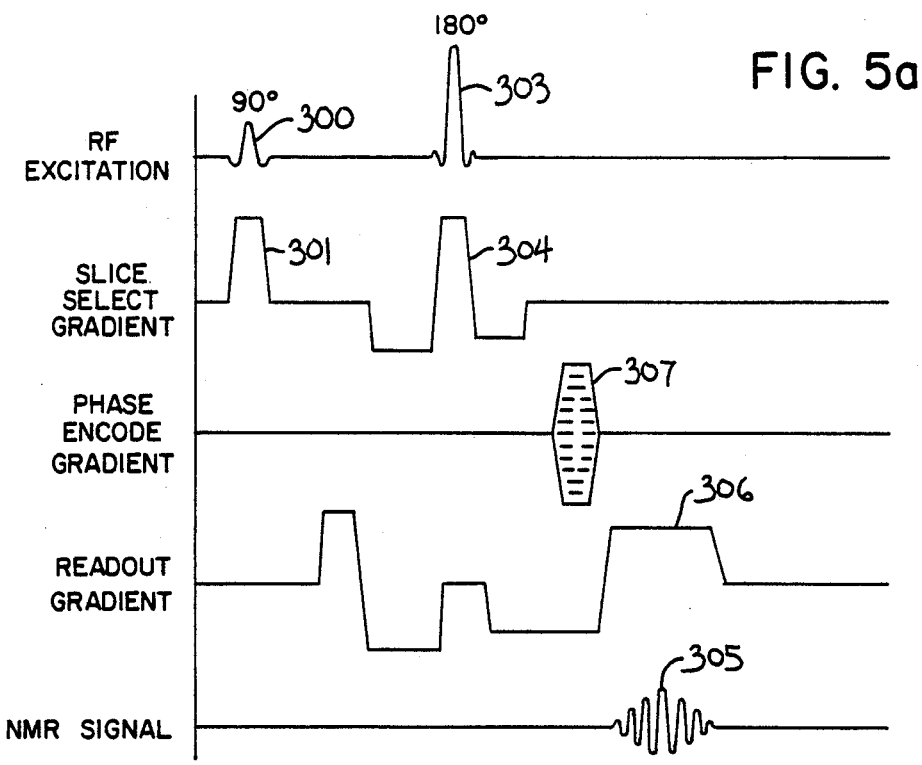
FIGS. 5A and 5B are graphic representations of the NMR pulse sequence of FIG. 3 in which the gradient field moments have been nulled to reduce the production of flow and motion artifacts.
Figure 5B:
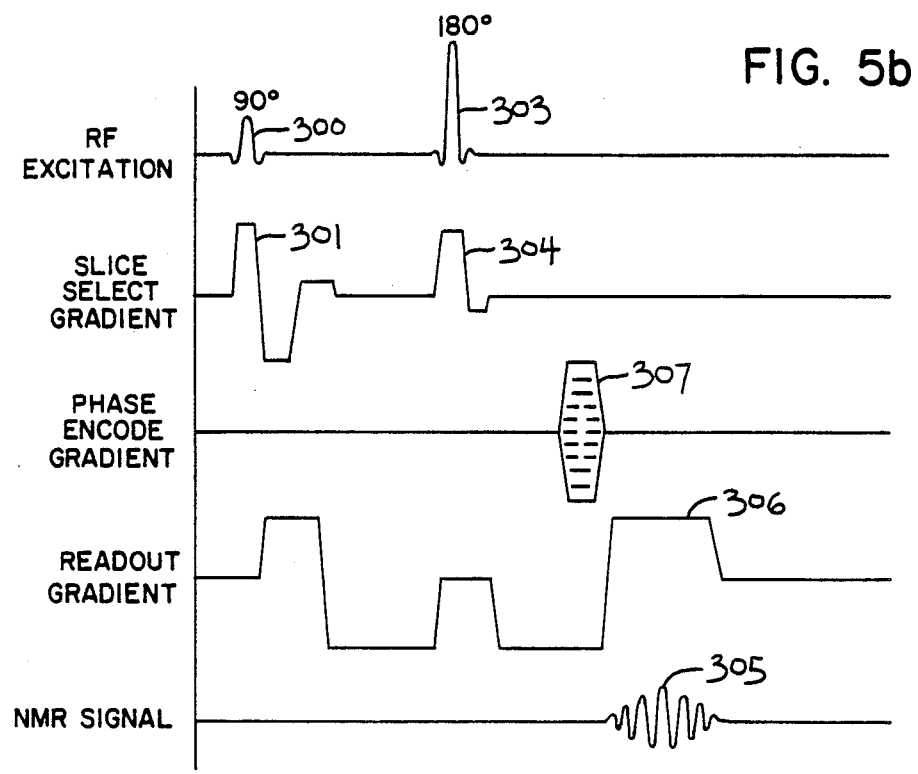

Two pulse sequences for suppressing motion artifacts using the gradient moment nulling technique are shown in FIGS. 5A and 5B. The sequence in FIG. 5A provides a first order motion correction that rephases spins which are stationary or are moving at a constant velocity. The sequence in FIG. 5B provides a second order motion correction that rephases spins which are stationary, are moving at a constant velocity, or are moving at a constant acceleration. Higher order correction sequences are also possible but are not shown. In both pulse sequences, additional gradient pulses are added to offset the dephasing effects of slice select pulses 301 and 304 and to offset the dephasing effects of readout gradient pulse 306. The phase encoding gradient pulse 307 is not offset, although it could be if significant motion artifacts are produced by it. Normally, this is not the case.

When a pulse sequence using gradient moment nulling is employed, it is used throughout the scan. That is, NMR data is acquired for 256 views with the only difference between the pulse sequences used in each view being the amplitude of the phase encoding pulse 307 as described above. The 256 by 256 element data arrays 310 and 311 (FIG. 4) are thus acquired with the gradient moment nulling pulses employed during each view.

Figure 7:
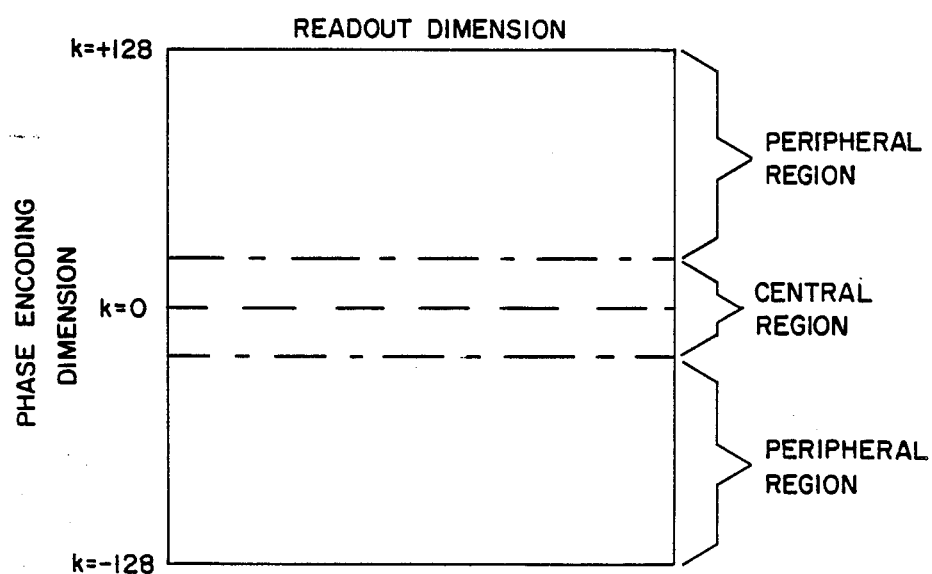
FIG. 7 is a pictorial representation of an acquired NMR data set showing the central region in which the motion artifact suppression technique is selectively employed.

It is a discovery of the present invention that medical images can be significantly improved from a diagnostic standpoint if the application of the gradient moment nulling technique is modified during the scan. More specifically, medical images can be improved if the gradient moment nulling technique is only employed during the acquisition of a selected few of the central views. As is well known to those skilled in the art, these low order phase encoding views contribute to the definition of larger objects in the reconstructed image. The remaining views are acquired with the conventional pulse sequence, such as that shown in FIG. 3. This is illustrated best in FIG. 7 for a 256 by 256 array of acquired NMR data, where each of the 256 rows is NMR data acquired during a different view with a different phase encoding gradient. The central region of this array is the views centered around the middle of this array which is the view designated k=0. Best results have been obtained when only four to eight of the 256 views are obtained with the gradient moment nulling pulses applied, and the order in which the views are acquired has no effect on the practice of the present invention.

When the method of the present invention is employed, the interior of blood vessels remain dark while the vessel walls are bright. This is in contrast to fully compensated images in which the signals produced by blood flowing through the vessels are fully rephased and appear bright in the resulting image. Since the boundary between the flowing blood and the vessel wall is of significant importance, the increased contrast between the flowing blood and the vessel wall provided by the present invention is an important improvement in the diagnostic value of the image. On the other hand, by applying the gradient moment nulling pulses during a selected few of the views, motion artifacts caused by movement of larger objects are effectively suppressed.

Figure 6:
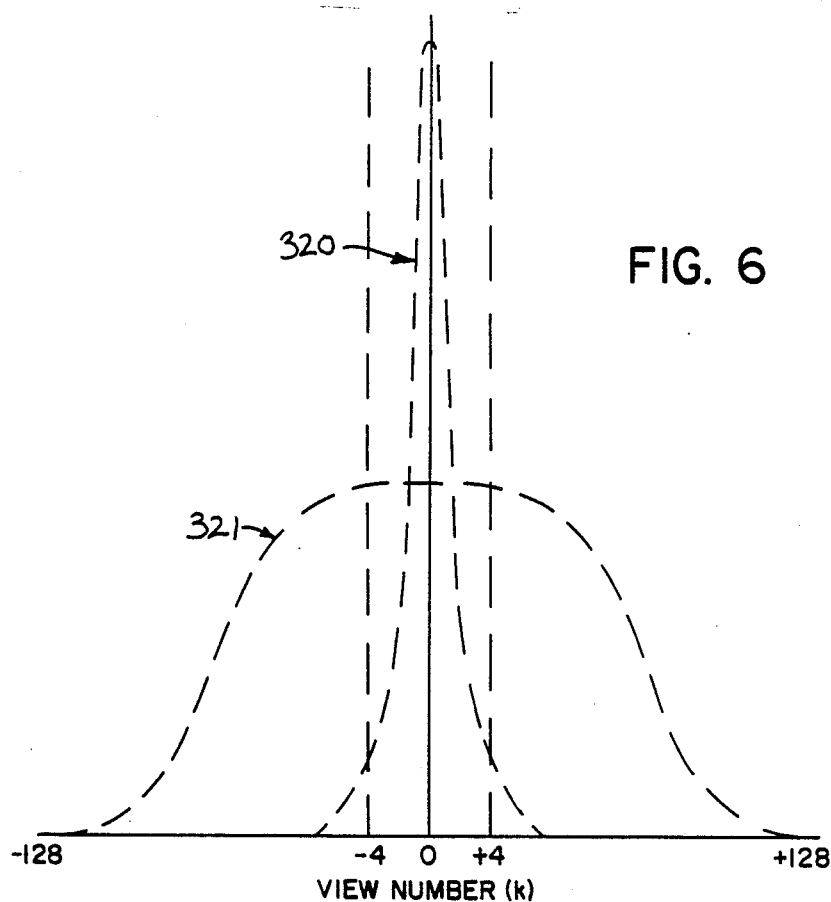
FIG. 6 is a graphic representation of the signals contributed by the different views during a scan for a large and a small object in the image.

The operation of the present invention can be better understood with reference to FIG. 6, which is a plot of NMR signal strength as a function of view number. The dashed line 320 is a profile of the NMR signals produced by a large object, such as the liver in a human. The profile is very narrow because most of the signal is contributed by the views which are close to the origin (k=0). On the other hand, the profile of the NMR signals from small objects, such as small blood vessels, is exemplified by dashed line 321. In this case, the profile is very broad because very significant signals are acquired at high view numbers.

As a result, when the gradient moment nulling method is employed only during a few views centered about the origin (k=0), larger objects are compensated for motion to a much larger degree than smaller objects. For example, if eight views centered about the origin (k=0) employ gradient moment nulling, most of the NMR signals which contribute to the image of large objects like the liver are rephased to suppress motion artifacts. In the example, 80% to 90% of the signals represented by curve 320 lie within the range from −4 to +4 view number. Conversely, most of the NMR signals which contribute to the image of small objects lie outside the −4 to +4 view number range are not subject to the suppression of motion artifacts. In the example profile 321, 60% to 70% of the contributing NMR signals remain dephased as a result of spin motion.

It should be apparent to those skilled in the art that the present invention may be carried out in many ways. The number of central views which are corrected for motion by rephasing the spin can be varied to adjust the size of the objects which are not compensated. With a scan comprised of 256 views, we have found that correction of from 2 to 10 of the central views produce diagnostically meaningful improvements to images. In addition, in the preferred embodiment selected central views are fully compensated and the peripheral views are completely uncompensated. In the alternative, the compensation can be graduated from a full compensation at the central views to a gradually reduced compensation in the peripheral views. Such a graduated implementation improves the overall method stability.

In addition, while the preferred embodiment of the present invention employs the gradient moment nulling technique for correcting the phase errors caused by motion, other correction methods may also be employed. For example, in copending U.S Pat. application Ser. No. 276,168 filed on Nov. 23, 1988 and entitled "Adaptive Method For Reducing Motion and Flow Artifacts In NMR Images", a method for retrospectively correcting the acquired NMR data set is described. In this case, the entire data set is acquired using the pulse sequence of FIG. 3, and then the central views of that acquired data set are corrected for phase errors caused by motion as described in this co-pending application.

It should also be apparent that the symmetric properties of the raw k space data allow the present invention to be implemented in a graded fashion along the x-frequency encoding direction. This can be accomplished by adjusting the flow compensation gradient pulse amplitudes and timing. These changes modify the rate of approach of the spin phases to zero at the center of the spin echo NMR signal and control the sensitivity of specific spatial frequencies ($k_x$) to phase shifts (i.e. the weighting of the flow compensation) in a manner analogous to what has been described above for spatial frequencies along Y. For example, a steep slope concentrates the flow compensation to the central spatial frequencies, while a lesser slope increases the flow compensation at higher spatial frequencies.

I claim:

1. In a method for correcting an NMR data set to suppress image artifacts caused by motion, the improvement comprising:

applying the corrective method only to views in a selected central region of the NMR data set; and reconstructing an image from the selectively corrected NMR data set using a Fourier transformation to produce an image in which motion artifacts are substantially suppressed in large scale objects, but motion artifacts are not substantially suppressed in small objects appearing in the image.

2. A method for producing an NMR image, the steps comprising:

acquiring NMR data for the peripheral regions of an NMR data set using a first NMR pulse sequence;

acquiring NMR data for the central region of the NMR data set using a second pulse sequence which employs motion artifact suppression gradient pulses; and reconstructing an image from the NMR data set using a Fourier transformation.

3. The method as recited in claim 2 in which the second pulse sequence employs gradient moment nulling to rephase signals produced by moving spins.

4. The method as recited in claim 2 in which the central region of the NMR data set is comprised of more than 2 views of acquired NMR data and less than 10 views of acquired NMR data.

* * * * *